(12) United States Patent
Lin et al.

(10) Patent No.: US 12,347,727 B2
(45) Date of Patent: Jul. 1, 2025

(54) TREATMENT OF SPIN ON ORGANIC MATERIAL TO IMPROVE WET RESISTANCE

(71) Applicant: Taiwan Semiconductor Manufacturing Co., Ltd., Hsinchu (TW)

(72) Inventors: Tzu-Yang Lin, Hsinchu (TW); Chen-Yu Liu, Hsinchu (TW); Cheng-Han Wu, Hsinchu (TW); Ching-Yu Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 494 days.

(21) Appl. No.: 17/737,821

(22) Filed: May 5, 2022

(65) Prior Publication Data

US 2023/0099053 A1    Mar. 30, 2023

Related U.S. Application Data

(60) Provisional application No. 63/227,609, filed on Jul. 30, 2021.

(51) Int. Cl.
*H01L 21/768* (2006.01)
*H01L 21/02* (2006.01)
*H01L 21/3213* (2006.01)

(52) U.S. Cl.
CPC .. *H01L 21/76865* (2013.01); *H01L 21/02118* (2013.01); *H01L 21/02282* (2013.01); *H01L 21/32134* (2013.01); *H01L 21/76802* (2013.01); *H01L 21/76831* (2013.01); *H01L 21/7684* (2013.01); *H01L 21/76843* (2013.01); *H01L 21/76871* (2013.01); *H01L 21/76877* (2013.01); *H01L 2221/1063* (2013.01)

(58) Field of Classification Search
None
See application file for complete search history.

(56) References Cited

U.S. PATENT DOCUMENTS

| | | | |
|---|---|---|---|
| 6,376,155 B2 * | 4/2002 | Ito | G03F 7/40 257/E21.038 |
| 6,465,352 B1 * | 10/2002 | Aoki | H01L 21/76802 257/E21.255 |
| 2005/0215713 A1 * | 9/2005 | Hessell | H01L 21/02282 525/162 |
| 2010/0055897 A1 | 3/2010 | Chon et al. | |
| 2019/0164824 A1 * | 5/2019 | Wang | H01L 21/32134 |

* cited by examiner

*Primary Examiner* — Erik Kielin
(74) *Attorney, Agent, or Firm* — Seed IP Law Group (57) ABSTRACT

The present disclosure provides example embodiments relating to conductive features, such as metal contacts, vias, lines, etc., and methods for forming those conductive features. In an embodiment, portions of an adhesion layer, barrier layer and/or seed layer is protected by a layer of an organic mask material as portions of the adhesion layer, barrier layer and/or seed layer are removed. The layer of organic mask material is modified to improve its resistance to penetration by wet etchants used to remove exposed portions of the adhesion layer, barrier layer and/or seed layer. An example modification includes treating the layer of organic mask material with a surfactant that is absorbed into the layer of organic mask material.

20 Claims, 9 Drawing Sheets

TREATMENT OF SPIN ON ORGANIC MATERIAL TO IMPROVE WET RESISTANCE

BACKGROUND

The semiconductor industry has experienced exponential growth. Technological advances in materials and design have produced generations of integrated circuits (ICs), where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. The scaling down process is not without its challenges. For example, as dimensions of features decreases, filling such features, such as vias and trenches, with conductive materials without formation of voids in the deposited conductive material becomes more challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, vias, lines, fins, etc., and methods for forming those conductive features. In some examples, a barrier layer and/or adhesion layer formed in an opening through a dielectric layer is pulled back (e.g., etched) to have a height in the opening that is below the top surface of the dielectric. Some example processes for pulling back the barrier layer and/or adhesion layer can cause a constriction at an upper region of the opening, and accordingly, in some examples, a subsequent pull-back (e.g., etch) is performed to smooth the barrier layer and/or adhesion layer to reduce or remove the constriction. Among other things, this can permit a conductive material deposited on the barrier layer and/or adhesion layer to be deposited in the opening without having a void formed in the conductive material.

Example embodiments described herein are described in the context of forming conductive features in Front End Of the Line (FEOL), Middle End Of the Line (MEOL), and/or Back End Of the Line (BEOL) processing for transistors. Implementations of some aspects of the present disclosure may be used in other processes and/or in other devices. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Figure 1:
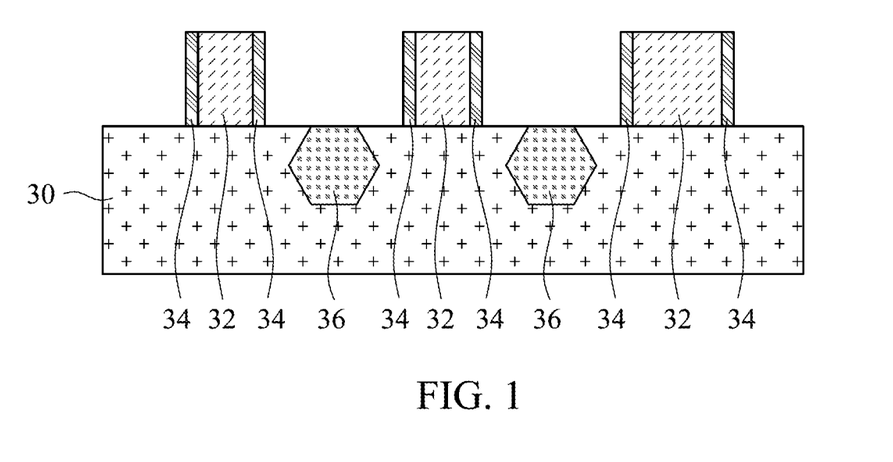
FIGS. 1 through 11 are cross-sectional views of respective intermediate structures during an example method for forming conductive features in accordance with some embodiments of the present disclosure.

FIGS. 1 through 11 illustrate cross-sectional views of respective intermediate structures during an example method for forming conductive features in accordance with some embodiments. FIG. 1 illustrates a semiconductor substrate or workpiece 30 with at least portions of devices formed thereon. The semiconductor substrate 30 may be or include a bulk semiconductor, a semiconductor-on-insulator (SOI) substrate, or the like, which may be doped (e.g., with a p-type or an n-type dopant) or undoped. Generally, a SOI substrate comprises a layer of a semiconductor material formed on an insulator layer. The insulator layer may be, for example, a buried oxide (BOX) layer, a silicon oxide layer, or the like. The insulator layer is provided on or is a substrate, typically a silicon or glass substrate. Other substrates, such as a multi-layered or gradient substrate may also be used. In some embodiments, the semiconductor material of the semiconductor substrate may include an elemental semiconductor like silicon (Si) and germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

As illustrated in the figures and described herein, the devices are Field Effect Transistors (FETs), which may be planar FETs or Fin FETs (FinFETs). In other implementations, the devices can include Vertical Gate All Around (VGAA) FETs, Horizontal Gate All Around (HGAA) FETs, nanostructure FETs, bipolar junction transistors (BJTs), diodes, capacitors, inductors, resistors, etc. In accordance with planar FETs, FinFETs and/or nanostructure FETs, gate stacks 32 are formed on active areas of the semiconductor substrate 30. In planar FETs, the active areas can be a portion at the top surface of the semiconductor substrate 30 delineated by isolation regions. In FinFETs, the active areas can be three-dimensional fins protruding from between isolation regions on the semiconductor substrate 30. In nanostructure FETs, the active areas can be three dimensional nanostructures, such as nanowires or nanosheets protruding from between isolation regions on the semiconductor substrate 30.

The gate stacks 32 can be operational gate stacks like in a gate-first process or can be dummy gate stacks like in a replacement gate process. Each gate stack 32 can comprise a dielectric layer over the active area, a gate layer over the dielectric layer, and, in some instances, a mask layer over the gate layer. The dielectric layer, gate layer, and mask layer for the gate stacks 32 may be formed by sequentially forming or depositing the respective layers, and then patterning those layers into the gate stacks 32. For example, in a gate-first process or a replacement gate process, the dielectric layer may include or be silicon oxide, silicon nitride, the like, or multilayers thereof; the gate layer may include or be silicon (e.g., polysilicon) or another material; and the mask layer may include or be silicon nitride, silicon oxynitride, silicon carbon nitride, the like, or a combination thereof. In a gate-first process, for example, the dielectric layer (e.g., gate dielectric) may include or be a high-k dielectric material, such as having a k value greater than about 7.0, which may include a metal oxide or silicate of Hf, Al, Zr, La, Mg, Ba, Ti, Pb, multilayers thereof, or a combination thereof, and the gate layer (e.g., gate electrode) may include or be a metal-containing material such as TiN, TaN, TaC, Co, Ru, Al, multi-layers thereof, or a combination thereof. Processes for forming or depositing the dielectric layer, gate layer, and mask layer include thermal and/or chemical growth, Chemical Vapor Deposition (CVD), Plasma-Enhanced CVD (PECVD), Molecular-Beam Deposition (MBD), Atomic Layer Deposition (ALD), Physical Vapor Deposition (PVD), and other deposition techniques.

The layers for the gate stacks 32 may then be patterned to be the gate stacks 32, for example, using photolithography and one or more etch processes. For example, a photo resist can be formed on the mask layer (or gate layer, for example, if no mask layer is implemented), such as by using spin-on coating, and can be patterned by exposing the photo resist to light using an appropriate photomask. Exposed or unexposed portions of the photo resist may then be removed depending on whether a positive or negative resist is used. The pattern of the photo resist may then be transferred to the layers of the gate stacks 32, such as by using one or more suitable etch processes. The one or more etch processes may include a reactive ion etch (RIE), neutral beam etch (NBE), the like, or a combination thereof. The etching may be anisotropic. Subsequently, the photo resist is removed in an ashing or wet strip processes, for example.

Gate spacers 34 are formed along sidewalls of the gate stacks 32 (e.g., sidewalls of the dielectric layer, gate layer, and mask layer) and over the active areas on the semiconductor substrate 30. The gate spacers 34 may be formed by conformally depositing one or more layers for the gate spacers 34 and anisotropically etching the one or more layers, for example. The one or more layers for the gate spacers 34 may include or be silicon nitride, silicon oxynitride, silicon carbon nitride, the like, multi-layers thereof, or a combination thereof, and the etch process can include a RIE, NBE, or another etching process.

Source/drain regions 36 are formed in the active regions on opposing sides of a gate stack 32. In some examples, the source/drain regions 36 are formed by implanting dopants into the active areas using the gate stacks 32 and gate spacers 34 as masks. Hence, source/drain regions 36 can be formed by implantation on opposing sides of each gate stack 32. In other examples, the active areas may be recessed using the gate stacks 32 and gate spacers 34 as masks, and epitaxial source/drain regions 36 may be epitaxially grown in the recesses. Epitaxial source/drain regions 36 may be raised in relation to the active area. The epitaxial source/drain regions 36 may be doped by in situ doping during the epitaxial growth and/or by implantation after the epitaxial growth. Hence, source/drain regions 36 can be formed by epitaxial growth, and possibly with implantation, on opposing sides of each gate stack 32. Example dopants for source/drain regions 36 can include or be, for example, boron for a p-type device and phosphorus or arsenic for an n-type device, although other dopants may be used. The source/drain regions 36 may have a dopant concentration in a range from about $10^{19}$ cm$^{-3}$ to about $10^{21}$ cm$^{-3}$.

Figure 2:
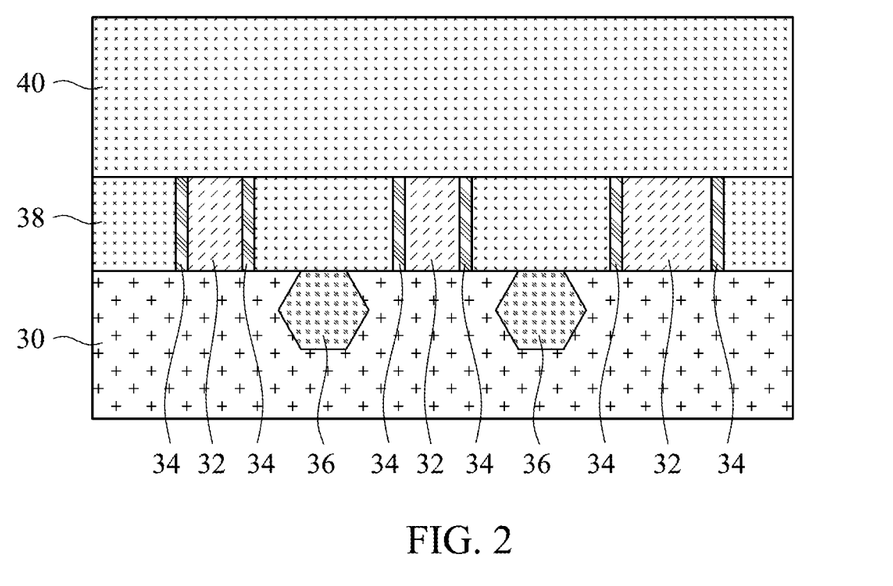

FIG. 2 illustrates the formation of a first interlayer dielectric (ILD) 38 and a second ILD 40. The first ILD 38 and second ILD 40 may each include an etch stop layer (ESL) and a principal dielectric layer such as a low-k dielectric layer, for example. Generally, an etch stop layer can provide a mechanism to stop an etching process when forming, e.g., contacts or vias. An etch stop layer may be formed of a dielectric material having a different etch selectivity from adjacent layers, for example, the principal dielectric layer of the ILD.

The first ILD 38 is deposited over the active areas, gate stacks 32, and gate spacers 34. For example, the etch stop layer may be conformally deposited over the active areas, gate stacks 32, and gate spacers 34. The etch stop layer may comprise or be silicon nitride, silicon carbon nitride, silicon carbon oxide, carbon nitride, the like, or a combination thereof, and may be deposited by CVD, PECVD, ALD, or another deposition technique. Then, for example, the principal dielectric layer 40 is deposited over the etch stop layer. The principal dielectric layer may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), $SiO_xC_y$, Spin-On-Glass, Spin-On-Polymers, silicon carbon material, a compound thereof, a composite thereof, the like, or a combination thereof. The principal dielectric layer may be deposited by spin-on, CVD, Flowable CVD (FCVD), PECVD, PVD, or another deposition technique.

The first ILD 38 can be planarized after being deposited. A planarization process, such as a Chemical Mechanical Polish (CMP), may be performed to planarize the first ILD 38. In some processes, such as in a gate-first process, the top surface of the first ILD 38 may be above top surfaces of the gate stacks 32. In other processes, such as a replacement gate process, the top surface of the first ILD 38 is planarized to be coplanar with top surfaces of the gate stacks 32 to thereby expose the gate stacks 32 through the first ILD 38. In such process, the planarization may remove the mask layer of the gate stacks 32 (and, in some instances, upper portions of the gate spacers 34), and accordingly, top surfaces of the gate layer of the gate stacks 32 are exposed through the first ILD 38.

In a replacement gate process, the gate stacks 32 exposed through the first ILD 38 can be removed and replaced with other gate stacks 32. Once exposed through the first ILD 38, the gate layer and dielectric layer of the gate stacks 32 are removed, such as by one or more etch processes. The gate layer may be removed by an etch process selective to the gate layer, wherein the dielectric layer can act as an etch stop layer, and subsequently, the dielectric layer can be removed by a different etch process selective to the dielectric layer. The etch processes can be, for example, a RIE, NBE, a wet etch, or another etch process. Replacement gate stacks can be formed as the gate stacks 32 where the gate stacks 32 were removed. The replacement gate stacks 32 can each include one or more conformal layers and a gate electrode over the one or more conformal layers. The one or more conformal layers include a gate dielectric layer and may include one or more work-function tuning layers.

The gate dielectric layer can be conformally deposited where the gate stacks 32 were removed (e.g., on surfaces of the active areas and sidewalls and top surfaces of the gate spacers 34) and on the top surface of the first ILD 38. The gate dielectric layer can be or include silicon oxide, silicon nitride, a high-k dielectric material, multilayers thereof, or other dielectric material. A high-k dielectric material may have a k value greater than about 7.0, and may include a metal oxide of or a metal silicate of Hf, Al, Zr, La, Mg, Ba, Ti, Pb, or a combination thereof. The gate dielectric layer can be deposited by ALD, PECVD, MBD, or another deposition technique.

Then, if implemented, a work-function tuning layer may be conformally deposited on the gate dielectric layer. The work-function tuning layer may include or be tantalum, tantalum nitride, titanium, titanium nitride, the like, or a combination thereof, and may be deposited by ALD, PECVD, MBD, or another deposition technique. Any additional work-function tuning layers may be sequentially deposited similar to the first work-function tuning layer.

A layer for the gate electrodes is formed over the one or more conformal layers. The layer for the gate electrodes can fill remaining regions where the gate stacks 32 were removed. The layer for the gate electrodes may be or comprise a metal-containing material such as Co, Ru, Al, W, Cu multi-layers thereof, or a combination thereof. The layer for the gate electrodes can be deposited by ALD, PECVD, MBD, PVD, or another deposition technique.

Portions of the layer for the gate electrodes and the one or more conformal layers above the top surface of the first ILD 38 are removed. For example, a planarization process, like a CMP, may remove the portions of the layer for the gate electrodes and the one or more conformal layers above the top surface of the first ILD 38. The replacement gate stacks 32 comprising the gate electrodes and one or more conformal layers may therefore be formed.

The second ILD 40 is deposited over the first ILD 38. For example, the etch stop layer may be conformally deposited over the first ILD 38. Then, for example, the principal dielectric layer is deposited over the etch stop layer. The etch stop layer and principal dielectric layer of the second ILD 40 can be or include the same or similar materials and can be deposited using the same or similar techniques as described above with respect to the first ILD 38. The second ILD 40 can be planarized, such as by a CMP, after being deposited.

Figure 3:
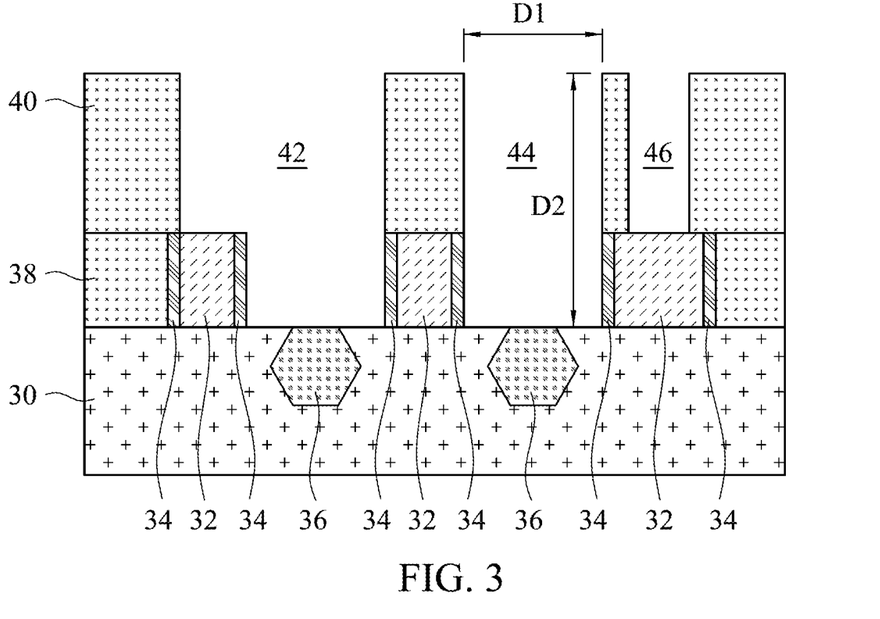

FIG. 3 illustrates the formation of openings 42, 44, and 46 through the second ILD 40 and the first ILD 38. The first opening 42 exposes a gate stack 32 and an adjoining source/drain region 36. The first opening 42 is therefore for forming a butted conductive feature between the exposed gate stack 32 and adjoining source/drain region 36. The second opening 44 exposes a source/drain region 36, and is therefore for forming a conductive feature to the exposed source/drain region 36. The third opening 46 exposes a gate stack 32, and is therefore for forming a conductive feature to the exposed gate stack 32. The openings 42, 44, and 46 may be formed using, for example, appropriate photolithography and etching processes. As an example, the opening 44 can have a first dimension D1 (e.g., a width) in a range from about 10 nm to about 50 nm, and can have a second dimension D2 (e.g., a height) in a range from about 50 nm to about 200 nm. An aspect ratio of the opening 44 (e.g., a ratio of the second dimension D2 to the first dimension D1) can be in a range from about 2 to about 4. In other embodiments, the opening 44 can have a first dimension D1 that is less than about 10 nm and a second dimension D2 that is less than 50 nm. In some embodiments, the aspect ratio of opening 44 is less than 2 and in other embodiments is greater than 4. In some embodiments, the pitch between openings 42, 44 or 46 is below 50 nm.

Figure 4:
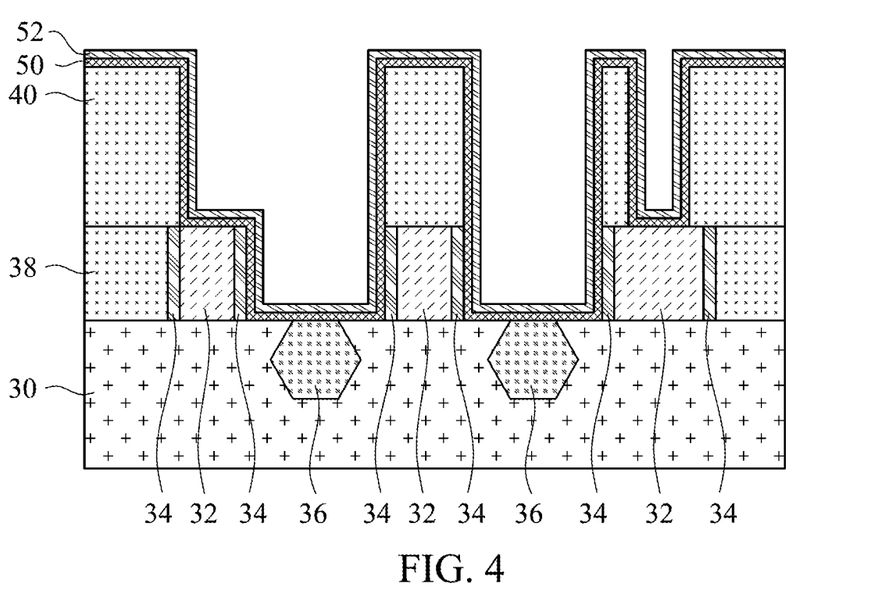

FIG. 4 illustrates the formation of a barrier layer 50 conformally in the openings 42, 44, and 46, and a seed layer 52 on the barrier layer 50. Though not illustrated, in some embodiments, an adhesion layer may be conformally formed in the openings 42, 44 and 46 prior to forming barrier layer 50. The adhesion layer may be conformally deposited in the openings 42, 44, and 46, such as on the exposed source/drain regions 36, exposed gate stacks 32, sidewalls of the first ILD 38 and second ILD 40, and the top surface of the second ILD 40. The barrier layer 50 is conformally deposited on the adhesion layer (when present) or formed in the openings 42, 44 and 46 prior to forming seed layer 52. When the adhesion layer is not present, the barrier layer 50 is conformally deposited in the openings 42, 44, and 46, such as on the exposed source/drain regions 36, exposed gate stacks 32, sidewalls of the first ILD 38 and second ILD 40, and the top surface of the second ILD 40. In some embodiments, the seed layer 52 is conformally formed, e.g., deposited in the openings 42, 44 and 46, such as on the barrier layer 50. In other embodiments, the seed layer 52 is not formed and the process steps described below with reference to FIG. 5 proceeds in the absence of the seed layer 52. In the present disclosure, the barrier layer 50 and seed layer 52 are referred to as a conductive layer or conductive feature. The adhesion layer may be or comprise, for example, titanium, cobalt, nickel, the like, or a combination thereof, and may be deposited by ALD, CVD, or another deposition technique. The barrier layer 50 may be or comprise titanium nitride, titanium oxide, tantalum nitride, tantalum oxide, the like, or a combination thereof, and may be deposited by ALD, CVD, or another deposition technique. The seed layer 52 may be or comprise a conductive material such as copper, aluminum, tungsten, cobalt, alloys thereof or other suitable conductive material, and may be deposited by ALD, CVD, plating or another formation technique. Silicide regions may be formed on upper portions of the source/drain regions 36 by reacting upper portions of the source/drain regions 36 with the adhesion layer and/or barrier layer 50. An anneal can be performed to facilitate the reaction of the source/drain regions 36 with the adhesion layer and/or barrier layer 50. In a particular example, the adhesion layer is a layer of titanium, the barrier layer 50 is a layer of titanium nitride and seed layer 52 is copper. The adhesion layer, barrier layer 50 and seed layer 52 may have various thicknesses as described below following further processing. While it is possible that a conductive material can be deposited onto seed layer 52, as dimensions of openings 42, 44 and 46 decrease, the likelihood that a bridge occurs over the opening during the deposition of the conductive material onto seed layer 52 and produces a void increases. For example, when the dimension of openings 42, 44 and 46 approaches 10 nm and/or the pitch between openings 42, 44 and 46 approaches 50 nm or less, increased formation of voids in the deposited conductive material may occur. Accordingly, in accordance with embodiments of the present disclosure, an organic material layer or feature is utilized as a hard mask to protect portions of the seed layer 52 in the bottom of openings 42, 44 and 46 while portions of seed layer 52 near the top of the openings 42, 44 and 46 are removed. Removal of portions of seed layer 52 near the top of openings 42, 44 and 46 increases the dimension of the openings 42, 44 and 46 through which conductive material may be deposited onto seed layer 52. This increased dimension reduces the likelihood that bridging will occur across the top of openings 42, 44 and 46; thereby reducing the likelihood of the formation of a void in the deposited conductive material.

Figure 5:
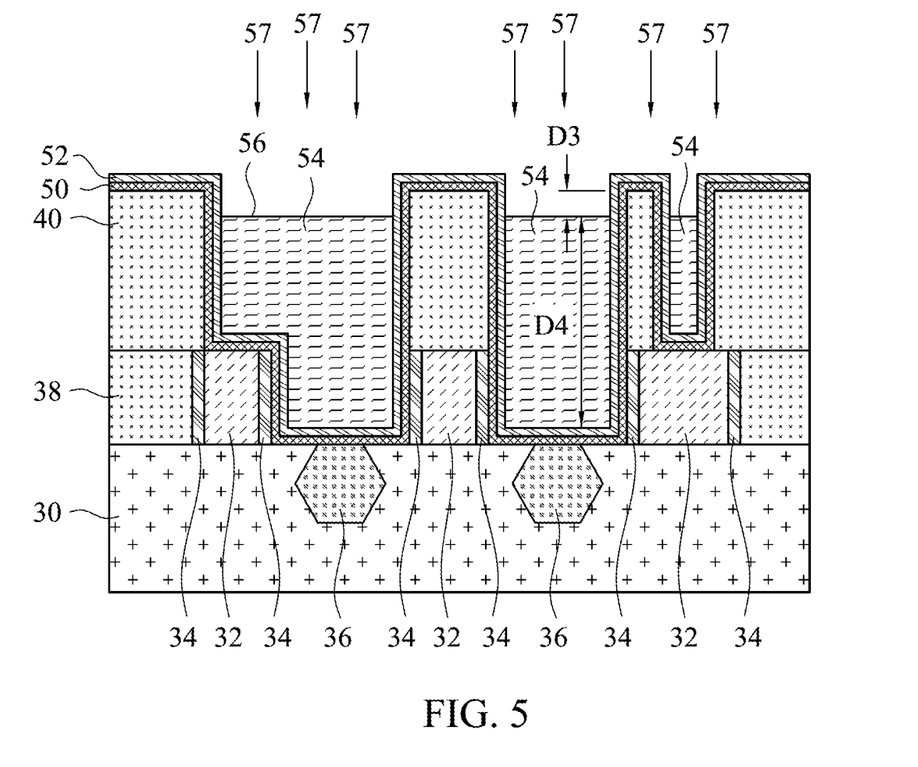

FIG. 5 illustrates the formation of the organic material feature, e.g., Bottom Anti-Reflection Coating (BARC) 54 in the openings 42, 44, and 46 over the seed layer 52 or in embodiments where seed layer 52 is not present, or over barrier layer 50. The foregoing description proceeds with reference to an embodiment where seed layer 52 is present. The BARC 54 may be, for example, an organic material or another material deposited by spin-coating or another deposition technique. The organic material includes organic materials that can be spin coated, such as phenol formaldehyde or acrylate polymers. The following description of one embodiment of the present disclosure proceeds with reference to BARC as the material 54; however, it is understood that the material 54 can be an organic material that is not a BARC. The BARC 54 may be initially deposited in the openings 42, 44, and 46 and to a level above the top surface of the second ILD 40 and/or above top surfaces of the seed layer 52. The BARC 54 may subsequently be etched back to have top surfaces below the top surface of the second ILD 40. For example, the BARC 54 may be etched back to a third dimension D3 below the top surface of the second ILD 40, which third dimension D3 can be in a range from about 15 nm to about 40 nm. In other embodiments, D3 is less than about 15 nm or is greater than 40 nm. Further, a fourth dimension D4 is from a bottom surface of the opening 44 (e.g., a surface of the active area to which the opening 44 is formed) to the top surface of the BARC 54. In some embodiments, a ratio of the fourth dimension D4 to the second dimension D2 is less than 1, such as less than about 0.7, and more particularly, in a range from about 0.3 to about 0.7. In other embodiments, the ratio of the fourth dimension D4 to the second dimension D2 is greater than 1.

The etch back may be or include a dry (e.g., plasma) etch process. The plasma etch process may include a RIE, NBE, ICP etch, the like, or a combination thereof. Example etchant gases that can be used for a plasma etch process include argon (Ar) gas or another etchant gas. A flow rate of the etchant gas(es) of a plasma etch process may be in a range from about 2000 sccm to about 5000 sccm. A plasma etch process may implement a DC substrate bias in a range from about 100 kV to about 300 kV. A power of a plasma etch process may be in a range from about 500 W to about 1500 W. A pressure of a plasma etch process may be in a range from about 3 mtorr to about 5 mtorr. The depth of the etch back (e.g., the third dimension D3) can be controlled by a duration of the etch process used for the etch back. A duration of a plasma etch process can be in a range from about 15 seconds to about 120 seconds.

Etching back of the BARC in accordance with an embodiment of the present disclosure, produces a surface 56 of BARC 54, e.g., an upper exposed surface of BARC 54. In accordance with an embodiment of the present disclosure, upper surface 56 of BARC 54 is altered or modified to increase its resistance to penetration by a material, e.g., a wet aqueous based etchant such as hydrogen peroxide, hydrochloric acid, diluted hydrofluoric acid or ammonium hydroxide that is used to etch back seed layer 52 or barrier layer 50 as described below in more detail with regard to FIG. 6. It has been observed that in some instances certain wet etchants can penetrate the unaltered or unmodified BARC 54. When a wet etchant penetrates the unaltered or unmodified BARC 54, the conductive seed layer 52 or other conductive layer of material under the unaltered or unmodified BARC may be damaged or etched away. Penetration of the etchant into the unaltered or unmodified BARC 54 can also cause the BARC 54 to swell in unwanted ways which can negatively impact subsequent semiconductor processing steps. In accordance with an embodiment of the present disclosure, the upper surface 56 of BARC 54 is contacted with a surfactant which alters the BARC 54 in a way which increases the resistance of the BARC 54 to penetration by wet etchants. Without intending to be bound to any particular theory, it is believed that the surfactant penetrates into pores or interstitial openings within the BARC, causing the altered or modified BARC to be more hydrophobic compared to the BARC before contacting with the surfactant.

Referring to FIG. 5, surfactant 57 is contacted with exposed surface 56 of BARC 54, and other features on the workpiece, such as exposed portions of seed layer 52. In accordance with some embodiments, surfactant 57 is exposed to BARC 54 under conditions that permit a sufficient amount of the surfactant to be absorbed by BARC 54 such that the resistance of the BARC to penetration by a wet etchant is increased. For example, surfactant 57 is contacted with BARC 54 at temperatures at which the BARC is maintained after etching back of the BARC to uncover portions of seed layer 52. Examples of such temperatures include a temperature between 15-27° C. In other embodiments, the surfactant 57 is contacted with BARC 54 at temperatures above 27° C. or below 15° C. In some embodiments, the surfactant is contacted with the BARC 54 for a length of time ranging between 10 to 180 seconds. When the BARC is contacted with the surfactant 57 for an insufficient period of time, e.g., less than 10 seconds, the amount of surfactant absorbed by the BARC may be insufficient to alter the BARC's resistance to penetration by a wet etchant. When the BARC is contacted with the surfactant 57 for an excessive period of time, e.g., more than 180 seconds, unwanted swelling of the BARC may occur. Because the ability of the BARC to absorb the surfactant will depend upon the chemical composition of the BARC and the surfactant, in some embodiments, the surfactant 57 is contacted with BARC 54 for a length of time that is less than 10 seconds and in other embodiments the surfactant 57 is contacted with BARC 54 for a length of time greater than 180 seconds, without suffering from the drawbacks described above. The BARC 54 needs to absorb a sufficient amount of the surfactant to alter or modify the BARC such that the ability of wet etchant's to penetrate the BARC is reduced. In accordance with some embodiments, the BARC 54 absorbs 0.01 to 10 weight % of the surfactant. In other embodiments, the BARC absorbs 1 to 10 weight % of the surfactant. When an insufficient amount of surfactant is absorbed by the BARC, the resistance of the modified BARC to penetration by a wet etchant is not increased. In some embodiments, the BARC absorbs more than 10 weight % of the surfactant. When the BARC absorbs an excess amount of surfactant, unwanted swelling of the BARC can occur. In accordance with some embodiments, a sufficient amount of surfactant is provided when the amount of surfactant contacted with the BARC can be on the order of 10 or more cc of surfactant per wafer depending on the size of the wafer.

In accordance with some embodiments, the surfactant is chosen from materials that can be absorbed by the organic material layer, e.g., BARC 54, and which once absorbed will increase the resistance of the organic material layer to penetration by wet etchants used in subsequent steps to remove portions of the seed layer 52 or barrier layer 50. Such materials include materials that can increase the hydrophobicity of the organic material layer; thereby increasing the resistance of the organic material layer to aqueous actions such as hydrogen peroxide, hydrochloric acid, diluted hydrofluoric acid or ammonium hydroxide. The surfactant should also be susceptible to removal by processes that are used to remove the organic material layer, e.g., ashing or the like. In addition, the surfactant should not negatively affect the ability of the etchant to remove exposed portions of the seed layer 52 or barrier layer 50 as described below in more detail with respect to FIG. 5.

Specific examples of suitable surfactants include perhalo polymers having a zwitterionic end group. Such perhalo polymers can be represented by the general formula:

where n>4, wherein X is a halogen, such as fluorine, chlorine or bromine.

Examples of perhalo polymers include perfluoro polymers, perchloro polymers and perbromopolymers. Specific examples of perhalo polymers include polytetrafluoroethylene and poly perfluoro vinyl ether.

A zwitterionic end group is a group that includes an equal number of positively and negatively charged functional groups. Zwitterions are sometimes referred to as inner salts. Amino acids form zwitterions, with the isomer on the right below being a zwitterion.

Examples of zwitterions suitable as zwitterionic end groups in accordance with embodiments of the present disclosure can have one of the chemical formulas below:

Examples of surfactants useful in accordance with embodiments of the present disclosure include organic material layer modifying agents represented by one or more of the following chemical formulas:

n = 2 to 4 n = 1, 2, 3

Figure 6:
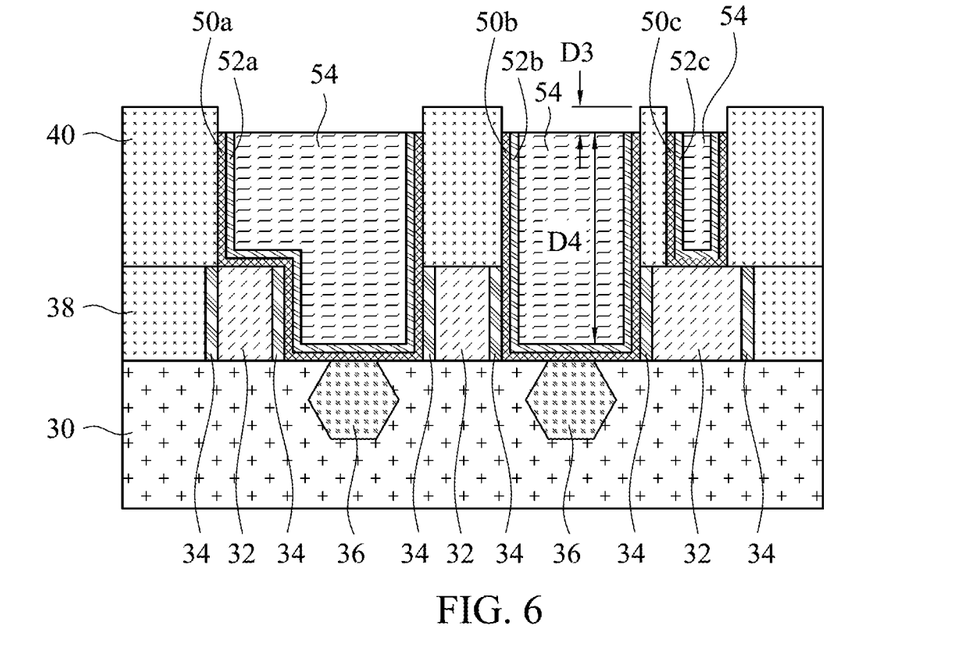

FIG. 6 illustrates the pulling back (e.g., removal by etching) of portions of the seed layer 52 and the barrier layer 50 above the top surfaces of the BARC 54 and at upper regions of the openings 42, 44, and 46. By removing the portions of the seed layer 52 and the barrier layer 50 above the top surfaces of the BARC 54 and at upper regions of the openings 42, 44, and 46, first, second, and third conductive feature barrier layers 50a, 50b, and 50c and first, second, and third conductive feature seed layers 52a, 52b, and 52c are formed in the first, second, and third openings 42, 44, and 46, respectively.

The portions of the seed layer 52 and barrier layer 50 may be removed using an etch process. The etch process can include a two-step wet etch process. A pre-treatment with a first wet etchant is performed. An example first wet etchant includes diluted hydrofluoric (dHF) acid. In some examples, the dHF may be diluted to about one part hydrofluoric (HF) acid to one hundred or more parts deionized water (DIW) (1: >=100, HF:DIW), such as in a range from about one part HF acid to one hundred parts DIW (1:100) to about one part HF acid to five hundred parts DIW (1:500). A second step etching with a second wet etchant is subsequently performed. Example second wet etchants include hydrofluoric (HF) acid, hydrogen peroxide ($H_2O_2$), ammonium hydroxide ($NH_4OH$), hydrochloric acid (HCl), a Standard Clean-1 (SC1), a Standard Clean-2 (SC2), the like, or a combination thereof, which may further be diluted in deionized water (DIW). For example, the second wet etchant can be a mixture of $NH_4OH$ or HCl with $H_2O_2$ and DIW at a ratio of 1:X:Y (($NH_4OH$ or HCl):$H_2O_2$:DIW), where X is in a range from about 1 to about 10, and Y is in a range from about 5 to about 120. A process time for the two-step wet etch process can be in a range from about 30 seconds to about 600 seconds, and a process temperature for the two-step wet etch process can be in a range from about 23° C. (e.g., room temperature) to about 67° C. The two-step wet etch process can be performed in situ in some examples. Other etch processes with different process parameters may be used.

The BARC 54 acts as a mask during the removal of the portions of the seed layer 52 and the barrier layer 50. Hence, top surfaces of, e.g., the second conductive feature barrier layer 50b and second conductive feature seed layer 52b can be at the third dimension D3 from the top surface of the second ILD 40 and/or at the fourth dimension D4 from the bottom surface of the opening 44. Further, the top surfaces of the second conductive feature barrier layer 50b and second conductive feature seed layer 52b can be at a position that has the ratio of the fourth dimension D4 to the second dimension D2.

Figure 7:
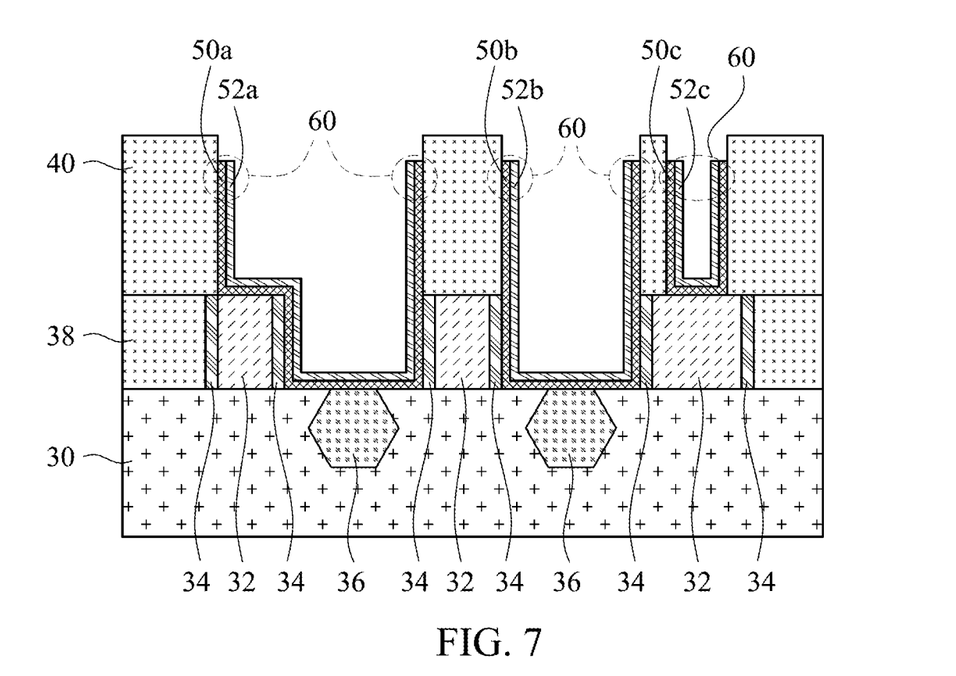

FIG. 7 illustrates the removal of the BARC 54. The BARC 54 may be removed by an ashing process, such as may use a plasma comprising oxygen ($O_2$), hydrogen ($H_2$), nitrogen ($N_2$), or another gas. After removal of the BARC 54, a residue and/or byproduct may be on upper surfaces of the conductive feature seed layers 52a, 52b, and 52c interior to the respective openings 42, 44, and 46. The residue and/or byproduct are at profiles 60. The byproduct and/or residue may result from the removing (e.g., etching) of the portions of the seed layer 52 and barrier layer 50 in FIG. 6 and/or from the removing the BARC 54 in FIG. 7. The byproduct and/or residue can decrease a dimension of and/or constrict the respective openings 42, 44, and 46 at the upper portions of the conductive feature barrier layers 50a, 50b, and 50c. The first, second, and third conductive feature barrier layers 50a, 50b, and 50c and first, second, and third conductive feature seed layers 52a, 52b, and 52c may have various dimensions.

Figure 8:
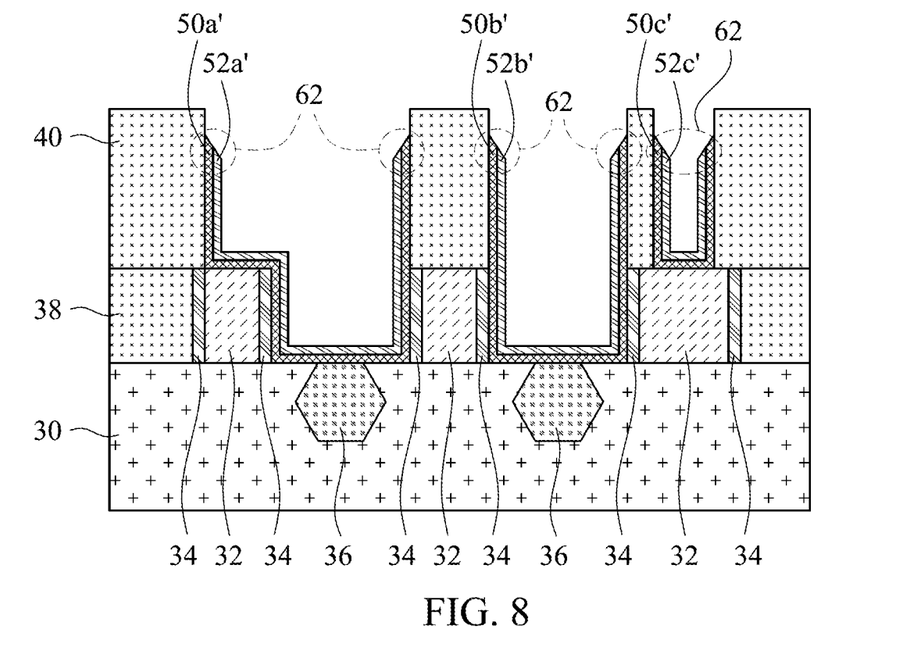

FIG. 8 illustrates subsequent pulling back (e.g., etching) of the conductive feature seed layers 52a, 52b, and 52c and conductive feature barrier layers 50a, 50b, and 50c to create modified conductive feature seed layers 52a', 52b', and 52c' and modified conductive feature barrier layers 50a', 50b', and 50c', respectively. The etching removes byproduct and/or residue from the surfaces of the upper portions of the conductive feature seed layers 52a, 52b, and 52c, and can smooth (e.g., by tapering) the upper portions of the conductive feature seed layers 52a, 52b, and 52c and conductive feature barrier layers 50a, 50b, and 50c. The smoothing of the modified conductive feature seed layers 52a', 52b', and 52c' and modified conductive feature barrier layers 50a', 50b', and 50c' are at profiles 62. The etching can further tune heights of the modified conductive feature seed layers 52a', 52b', and 52c' and modified conductive feature barrier layers 50a', 50b', and 50c' (e.g., reducing the respective heights), such as by increasing a duration of the etching. The first, second, and third modified conductive feature barrier layers 50a', 50b', and 50c' and first, second, and third modified conductive feature seed layers 52a', 52b', and 52c' may have various dimensions. The etching may be by a wet etch process, for example.

In some examples, the etching includes a two-step wet etch process. A pre-treatment with a first wet etchant is performed. An example first wet etchant includes diluted hydrofluoric (dHF) acid. In some examples, the dHF may be diluted to about one part hydrofluoric (HF) acid to one hundred or more parts deionized water (DIW) (1: >=100, HF:DIW), such as in a range from about one part HF acid to one hundred parts DIW (1:100) to about one part HF acid to five hundred parts DIW (1:500). A second step etching with a second wet etchant is subsequently performed. Example second wet etchants include hydrofluoric (HF) acid, hydrogen peroxide ($H_2O_2$), hydrochloric (HCl) acid, the like, or a combination thereof. In some examples, the second wet etchant may be diluted to about one part etchant to thirty or less parts DIW (1: <=30), such as in a range from about one part etchant to five parts DIW (1:5) to about one part etchant to thirty parts DIW (1:30). A process time for the two-step wet etch process can be in a range from about 30 seconds to about 300 seconds, and a process temperature for the two-step wet etch process can be in a range from about 23° C. (e.g., room temperature) to about 67° C.

The pre-treatment can etch a byproduct and/or residue on the conductive feature seed layers 52a, 52b, and 52c at a rate in a range from about 2 nm per minute to about 5 nm per minute, and can etch the conductive feature seed layers 52a, 52b, and 52c at a rate in a range from about 0.3 nm per minute to about 0.6 nm per minute. A selectivity of the etching of the pre-treatment (e.g., a ratio of the etch rate of the byproduct and/or residue to the etch rate of the conductive feature seed layers 52a, 52b, and 52c) can be in a range from about 2 to about 12. The second step can etch a byproduct and/or residue on the conductive feature seed layers 52a, 52b, and 52c at a rate in a range from about 0.5 nm per minute to about 1 nm per minute, and can etch the conductive feature seed layers 52a, 52b, and 52c at a rate in a range from about 0.3 nm per minute to about 1.5 nm per minute. A selectivity of the etching of the second step (e.g., a ratio of the etch rate of the byproduct and/or residue to the etch rate of the conductive feature seed layers 52a, 52b, and 52c) can be in a range from about 0.3 to about 3.

The two-step wet etch process can be performed in situ in some examples. The example two-step wet etch process can be performed without inducing damage to the gate stacks 32, for example. Other etch processes with different process parameters may be used.

Figure 9:
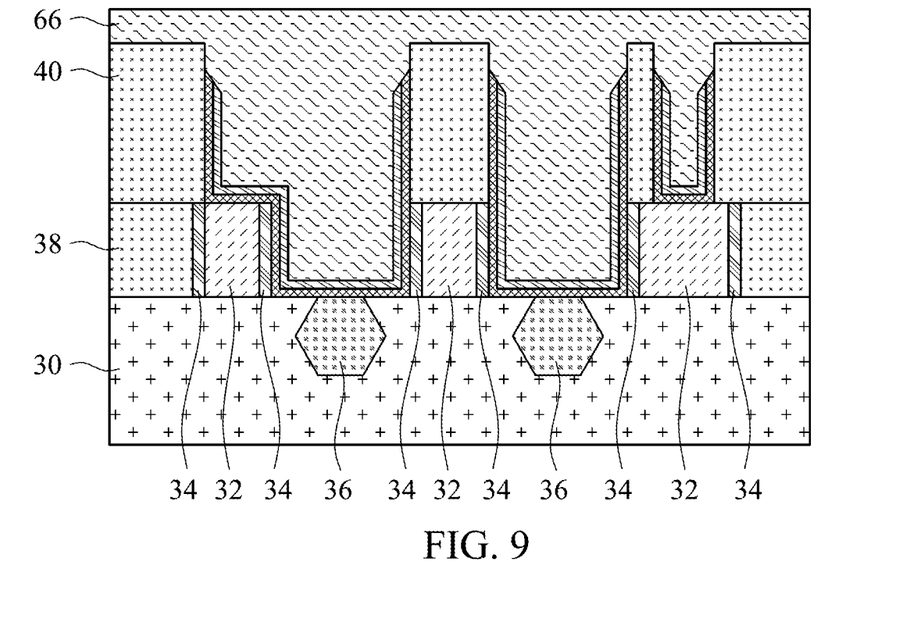

FIG. 9 illustrates the formation of conductive material 66 in the openings 42, 44, and 46 and on the modified conductive feature seed layers 52a', 52b', and 52c'. The conductive material 66 may be or comprise a metal, such as tungsten, copper, aluminum, gold, silver, alloys thereof, the like, or a combination thereof, and may be deposited by CVD, ALD, PVD, or another deposition technique. The smoothing forms, e.g., the modified conductive feature seed layers 52a', 52b', and 52c' can permit larger dimensions at upper portions of the openings 42, 44, and 46 compared to when the byproduct and/or residue is present (and, therefore, forming a constriction), and the larger dimensions can permit the conductive material 66 to better fill the openings 42, 44, and 46 without a void in the conductive material 66 in the openings 42, 44, and 46.

Figure 10:
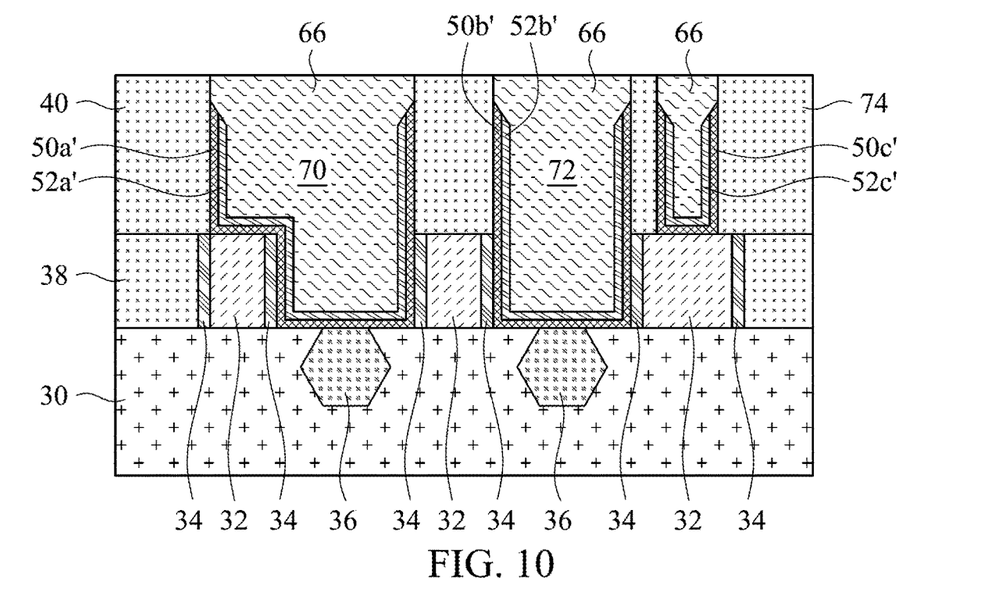

FIG. 10 illustrates the removal of excess conductive material 66. After the conductive material 66 is deposited, excess conductive material 66 over the top surface of the second ILD 40 may be removed by using a planarization process, such as a CMP, for example. The planarization process may remove excess conductive material 66 from above the top surface of the second ILD 40. This forms conductive features 70, 72, and 74 comprising the conductive material 66 in the openings 42, 44, and 46, respectively. Top surfaces of the conductive features 70, 72, and 74 and second ILD 40 may be coplanar. Accordingly, conductive features 70, 72, and 74 including the conductive material 66, seed layers 52a', 52b', and 52c', and barrier layers 50a', 50b', and 50c' (and, possibly, silicide regions) may be formed to corresponding gate stacks 32 and/or source/drain regions 36. As apparent from FIG. 10, the widths of the conductive material 66 of the conductive features 70, 72, and 74 at the top surfaces thereof are increased by pulling back the barrier layer 50 and the adhesion layer, which increases a surface area to which respective subsequent conductive features can make contact.

As shown by the preceding, aspects of some embodiments can be applied to Front End Of the Line (FEOL) and Middle End Of the Line (MEOL) processes. Conductive features 70, 72, and 74, including the processes by which the conductive features 70, 72, and 74 were formed, can implement aspects of various embodiments in FEOL and/or MEOL. Other conductive features formed in FEOL and/or MEOL processes may similarly incorporate aspects according to some embodiments. For example, replacement gate stacks can be formed according to some embodiments. For replacement gate stacks, for example, conformal layers, such as a dielectric layer and/or work-function tuning layer(s), that are formed where a dummy gate stack was removed can be deposited and pulled back according to the same or similar processes illustrated and described above with respect to FIGS. 4 through 8 for the barrier layer 50 and the seed layer 52, and the gate electrode may be deposited and formed like the conductive material 66 in FIGS. 9 and 10.

Figure 11:
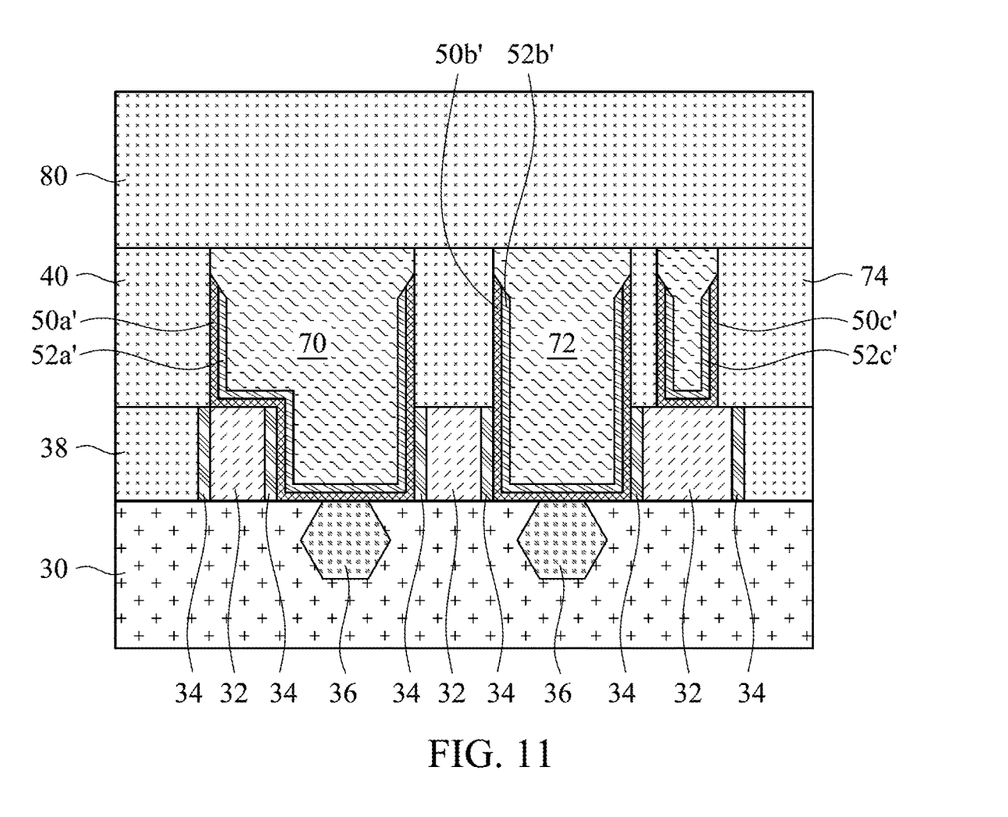

FIG. 11 illustrates the formation of an intermetallization dielectric (IMD) 80. The IMD 80 may include an etch stop layer (ESL) and a principal dielectric layer such as a low-k dielectric layer, for example. The IMD 80 is deposited over the second ILD 40 and conductive features 70, 72, and 74. For example, the etch stop layer may be deposited over the second ILD 40 and conductive features 70, 72, and 74. Then, for example, the principal dielectric layer is deposited over the etch stop layer. The etch stop layer and principal dielectric layer of the IMD 80 can be or include the same materials and can be deposited using the same techniques as described above with respect to the first ILD 38. The IMD 80 can be planarized after being deposited, such as by a CMP.

Figure 12:
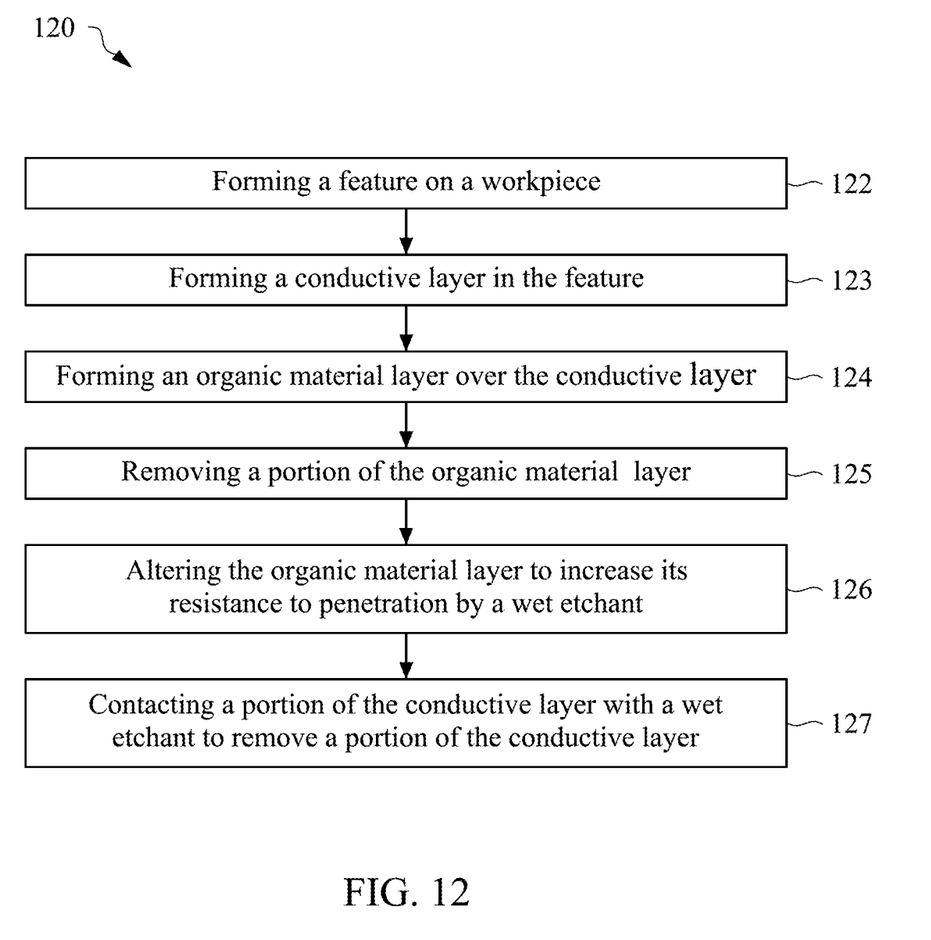
FIGS. 12-14 are flow charts of different embodiments of semiconductor processes carried out in accordance with embodiments of the present disclosure.

Referring to FIG. 12, a process 120 in accordance with the present disclosure includes operation 122 of forming a feature on a workpiece. Examples of such features include vias, trenches or other features to be filled with a conductive material. Process 120 includes operation 123 of forming a conductive layer in the feature. The conductive layer can be formed from an electrically conductive material such as copper, aluminum, tungsten, cobalt, alloys thereof, or other suitable conductive material. At operation 124 an organic material layer is formed over the conductive layer. Examples of organic material layer include organic polymers such as phenol formaldehyde or acrylate polymers. At operation 125, a portion of the organic material layer is removed. The portion of the organic material layer can be removed using one of the dry etch plasma process as described above. In some embodiments, the organic material layer is a BARC material. Next, the organic material layer is altered at operation 126 to increase its resistance to penetration by a wet agent used subsequently to remove portions of the conductive layer. Examples of materials that can alter organic material layer in this way are the surfactants described above. At operation 127, a portion of the conductive layer is contacted with a wet etchant to remove a portion of the conductive layer. Examples of wet etchants include the wet etchants described above.

Figure 13:
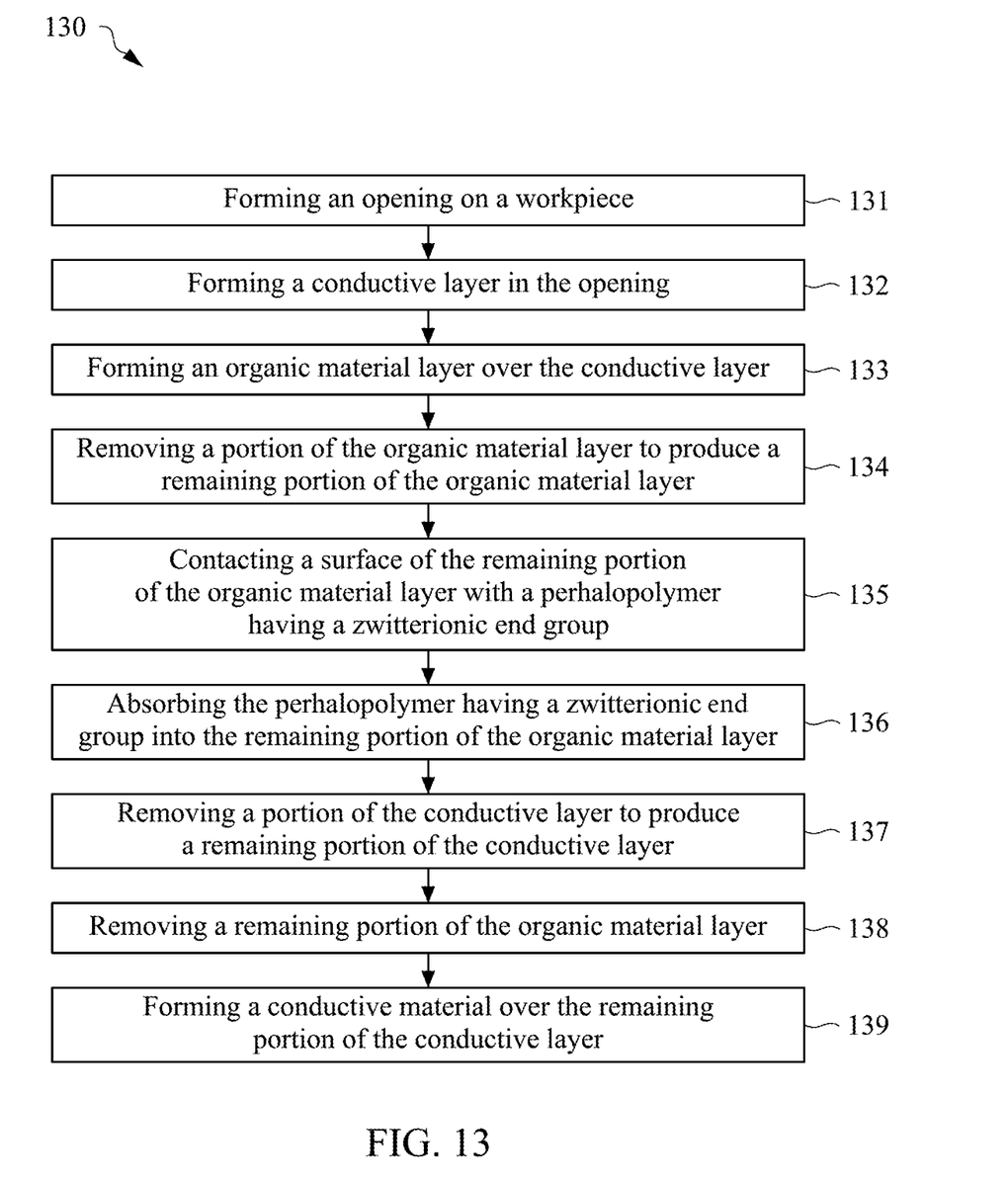

Referring to FIG. 13, in another embodiment, a semiconductor process 130 in accordance with the present disclosure includes operation 131-134 which are similar to operations 122-125 described above with respect to FIG. 12. The description above regarding operations 122-125 is equally applicable to operations 131-134 and is not reproduced here. Process 130 includes operation 135 of contacting a surface of the remaining portion of the organic material layer with a perhalopolymer having a zwitterionic end group. Examples of perhalopolymers having a zwitterionic end group include those described above. Method 130 includes operation 136 of absorbing the perhalopolymer having a zwitterionic end group into the remaining portion of the organic material layer. At operation number 137 a portion of the conductive layer is removed to produce a remaining portion of the conductive layer. Removal of a portion of the conductive layer can be achieved utilizing the wet etchants described above. Thereafter, the remaining portion of the organic material layer is removed at operation 138, e.g., by ashing, followed by forming a conductive material over the remaining portion of the conductive layer at operation number 139.

Figure 14:
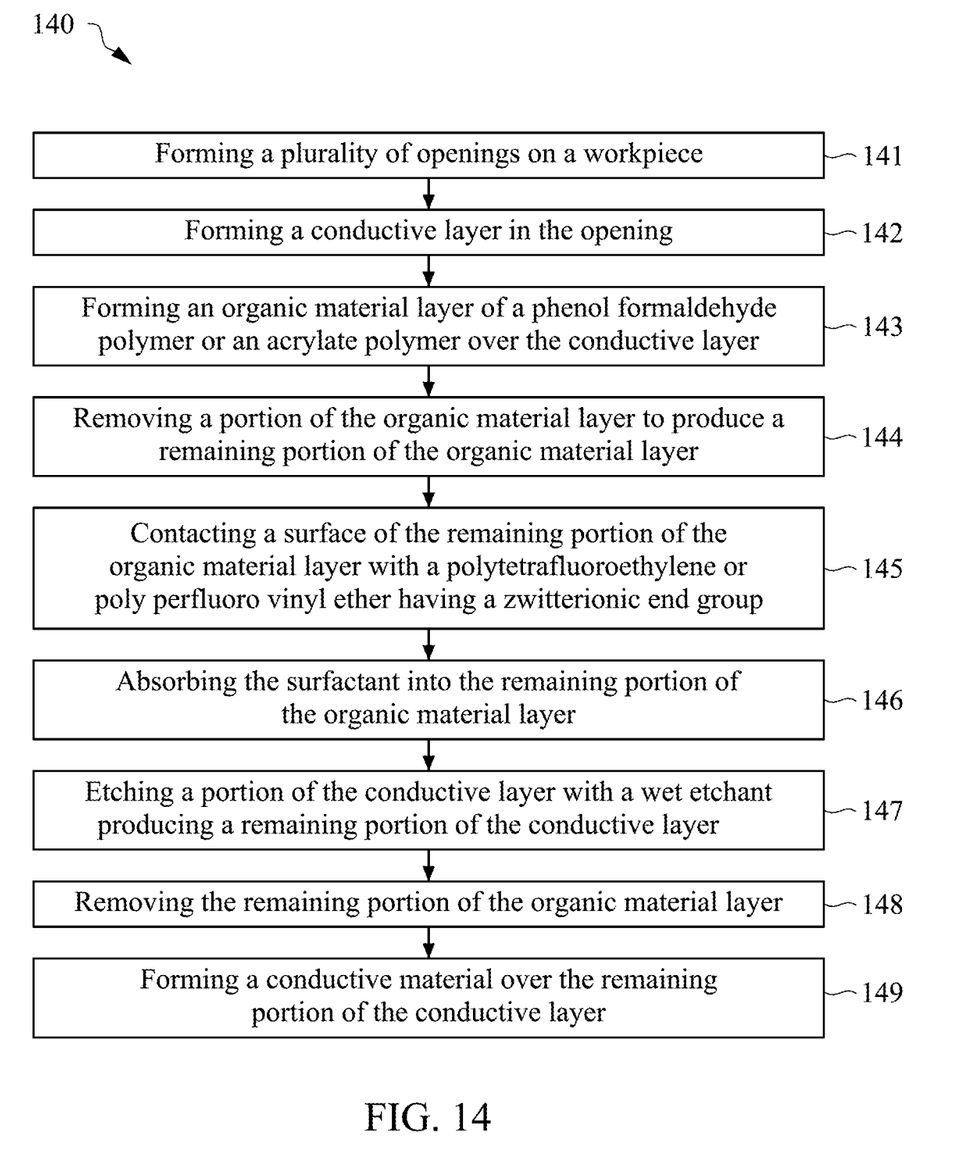

Referring to FIG. 14, in another embodiment, a semiconductor process 140 in accordance with the present disclosure includes operations 141-144 which are similar to operations 122-125 described above with respect to FIG. 12. The description above regarding operations 122-125 is equally applicable to operations 141-144 and is not reproduced here. Process 140 includes operation 145 of contacting a surface of the remaining portion of the organic material layer with a surfactant including a polytetrafluoroethylene or a poly perfluoro vinyl ether having a zwitterionic end group. At operation 146, the surfactant is absorbed into the remaining portion of the organic material layer. Process 140 proceeds to operation 147 of etching a portion of the conductive layer with a wet etchant to produce a remaining portion of the conductive layer. At operation 148, the remaining portion of the organic material layer is removed followed by operation 149 of forming a conductive material over the remaining portion of the conductive layer.

In accordance with some embodiments, a benefit of utilizing an organic material modifying agent, such as a surfactant, in accordance with embodiments of the present disclosure, is reduced penetration of wet etchants into the organic material. Reducing penetration of wet etchants into the organic material reduces the likelihood that the wet etchant will come in contact with portions of materials underlying the organic material and possibly etch away portions of the materials underlying the organic material. In addition, reducing penetration of wet etchants into the organic material reduces potential unwanted swelling of the organic material.

One aspect of this description relates to a semiconductor process that includes forming a feature on a workpiece. In accordance with such embodiments, a conductive layer is formed in the feature followed by formation of an organic material over the conductive layer. A portion of the organic material is removed. The remaining organic material layer is altered to increase its resistance to penetration by a wet etchant that is utilized in subsequent steps to remove a portion of the conductive layer. The method further includes a step of contacting a portion of the organic material layer with a wet etchant to remove a portion of the conductive layer.

Another aspect of this description relates to a semiconductor process that includes forming an opening on a workpiece and forming a conductive layer in the opening. An organic material is formed over the conductive layer and then a portion of the organic material layer is removed leaving behind a remaining portion of the organic material layer. A surface of the remaining portion of the organic material layer is contacted with a perhalo polymer that includes a zwitterionic end group. The perhalo polymer that includes a zwitterionic end group is absorbed by the remaining portion of the organic material layer. A portion of the conductive layer is then removed, in some embodiments utilizing a wet etchant, leaving behind a remaining portion of the conductive layer. Thereafter, a remaining portion of the organic material layer is removed and a conductive material is formed over the remaining portion of the conductive layer.

Another aspect of this description relates to a semiconductor process which includes forming a plurality of openings on a workpiece and forming a conductive layer in the openings. In accordance with these embodiments, an organic material layer is formed over the conductive layer. The organic material layer includes a polymer selected from a phenol formaldehyde polymer and acrylate polymers. A portion of the organic material layer is removed leaving behind a remaining portion of the organic material layer. The remaining portion of the organic material layer is contacted with a surfactant selected from polytetrafluoroethylene or poly perfluoro vinyl ether. A surfactant is absorbed into the remaining portion of the organic material. Thereafter, a portion of the conductive layer is etched with a wet etchant, thereby producing a remaining portion of the conductive layer. The remaining portion of the organic material layer is then removed and a conductive material is formed over the remaining portion of the conductive layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor process, comprising:
forming a feature on a workpiece;
forming a conductive layer in the feature;
forming an organic material layer over the conductive layer;
removing a portion of the organic material layer;
altering the organic material layer to increase its resistance to penetration by a wet etchant, wherein the altering the organic material layer to increase its resistance to penetration by the wet etchant includes contacting the organic material layer with a surfactant having a zwitterionic end group; and
contacting a portion of the conductive layer with the wet etchant, thereby removing the portion of the conductive layer.

2. The semiconductor process of claim 1, wherein the feature is an opening in an interlayer dielectric layer.

3. The semiconductor process of claim 1, wherein the feature is an opening and the conductive layer is a conductive line, conductive via or a conductive channel.

4. The semiconductor process of claim 1, wherein the forming an organic material layer includes forming the organic material layer using a spin on process.

5. The semiconductor process of claim 1, wherein the altering the organic material layer to increase its resistance to penetration by the wet etchant includes contacting the organic material layer with a perhalopolymer having a zwitterionic end group.

6. The semiconductor process of claim 1, wherein the altering the organic material layer to increase its resistance to penetration by the wet etchant includes contacting the organic material layer with a perfluoropolymer having the zwitterionic end group for 10 to 180 seconds.

7. The semiconductor process of claim 1, wherein the wet etchant is one or more of diluted hydrofluoric acid, hydrochloric acid, hydrogen peroxide and ammonium hydroxide.

8. The semiconductor process of claim 6, wherein the perfluoropolymer having the zwitterionic end group has a chemical formula selected from the following chemical formulas:

9. A semiconductor process, comprising:
forming an opening on a workpiece;
forming a conductive layer in the opening;
forming an organic material layer over the conductive layer;
removing a portion of the organic material layer, the removing the portion of the organic material layer producing a remaining portion of the organic material layer;
contacting a surface of the remaining portion of the organic material layer with a perhalopolymer having a zwitterionic end group;
absorbing the perhalopolymer having a zwitterionic end group into the remaining portion of the organic material layer;
removing a portion of the conductive layer, the removing the portion of the conductive layer producing a remaining portion of the conductive layer;
removing the remaining portion of the organic material layer; and
forming a conductive material over the remaining portion of the conductive layer.

10. The semiconductor process of claim 9, wherein the contacting the surface of the remaining portion of the organic material layer with a perhalopolymer having a zwitterionic end group is performed for 10 to 180 seconds.

11. The semiconductor process of claim 9, wherein the contacting the surface of the remaining portion of the organic material layer with the perhalopolymer having the zwitterionic end group and the absorbing the perhalopolymer having the zwitterionic end group into the remaining portion of the organic material layer are carried out at a temperature between 15° C. to 27° C.

12. The semiconductor process of claim 9, wherein the absorbing the perhalopolymer having the zwitterionic end group into the remaining portion of the organic material layer includes absorbing an amount of the perhalopolymer having a zwitterionic end group that is from 0.01 to 10 weight percent of the remaining portion of the organic material layer.

13. The semiconductor process of claim 9, wherein the perhalopolymer having the zwitterionic end group is a perfluoropolymer having a zwitterionic end group.

14. The semiconductor process of claim 13, wherein the perfluoropolymer having the zwitterionic end group has one of the following chemical formulas:

15. The semiconductor process of claim 13, wherein the perfluoropolymer is polytetrafluoroethylene or polyperfluorovinyl ether.

16. The semiconductor process of claim 9, wherein forming the opening on the workpiece includes forming a plurality of openings on a workpiece, two or more of the plurality of openings having a pitch of less than 50 nm.

17. A semiconductor process, comprising:
forming a plurality of openings on a workpiece;
forming a conductive layer in the openings;
forming an organic material layer over the conductive layer, the organic material layer including a polymer selected from phenol-formaldehyde polymers and acrylate polymers;
removing a portion of the organic material layer, the removing the portion of the organic material layer producing a remaining portion of the organic material layer;
contacting a surface of the remaining portion of the organic material layer with a surfactant selected from polytetrafluoroethylene or polyperfluorovinyl ether having a zwitterionic end group;
absorbing the surfactant into the remaining portion of the organic material layer;
etching a portion of the conductive layer with a wet etchant, the etching the portion of the conductive layer producing a remaining portion of the conductive layer;
removing the remaining portion of the organic material layer; and
forming a conductive material over the remaining portion of the conductive layer.

18. The semiconductor process of claim 17, wherein the absorbing the surfactant into the remaining portion of the organic material layer causes the remaining portion of the organic material layer to exhibit an increased resistance to penetration by the wet etchant.

19. The semiconductor process of claim 18, wherein the wet etchant is an aqueous solution.

20. The semiconductor process of claim 17, wherein the hydrophobicity of the remaining portion of the organic material layer before absorbing the surfactant is less than the hydrophobicity of the remaining portion of the organic material layer after absorbing the surfactant.

* * * * *